(12) United States Patent
Lei

(10) Patent No.: US 9,451,541 B2
(45) Date of Patent: Sep. 20, 2016

(54) SYSTEM AND METHOD FOR WIRELESS COMMUNICATION

(75) Inventor: Zhaojun Lei, Guangdong (CN)

(73) Assignee: SHENZHEN HAC TELECOM TECHNOLOGY CO., LTD., Shenzhen (CN)

(*) Notice: Subject to any disclaimer, the term of this patent is extended or adjusted under 35 U.S.C. 154(b) by 248 days.

(21) Appl. No.: 14/113,580

(22) PCT Filed: Jan. 11, 2012

(86) PCT No.: PCT/CN2012/070203
§ 371 (c)(1),
(2), (4) Date: Oct. 23, 2013

(87) PCT Pub. No.: WO2013/104116
PCT Pub. Date: Jul. 18, 2013

(65) Prior Publication Data
US 2014/0044032 A1 Feb. 13, 2014

(51) Int. Cl.
*H04W 52/02* (2009.01)
*H03M 13/15* (2006.01)

(52) U.S. Cl.
CPC ..... *H04W 52/0203* (2013.01); *H04W 52/0216* (2013.01); *H04W 52/0219* (2013.01); *H03M 13/15* (2013.01); *H04W 52/0229* (2013.01)

(58) Field of Classification Search
CPC .............. H04W 52/0216; H04W 52/0203; H04W 52/0219; H04W 52/0229; H04W 52/02; H04W 84/18; H04W 51/0219; H04W 76/02; H04W 52/0235; H04W 84/20; H04W 52/0245; H04W 72/0466; H03M 13/15; Y02B 60/50; G02C 2201/12
See application file for complete search history.

(56) References Cited

U.S. PATENT DOCUMENTS

| | | | | |
|---|---|---|---|---|
| 4,756,018 A | * | 7/1988 | Fujiwara | 455/560 |
| 5,059,836 A | * | 10/1991 | Lee et al. | 327/557 |
| 5,297,142 A | * | 3/1994 | Paggeot et al. | 370/461 |
| 5,606,313 A | * | 2/1997 | Allen et al. | 340/10.31 |
| 5,625,882 A | * | 4/1997 | Vook et al. | 340/7.34 |
| 5,991,635 A | * | 11/1999 | Dent et al. | 455/517 |
| 6,185,265 B1 | * | 2/2001 | Campanella | H03M 13/15 375/341 |
| 6,239,690 B1 | * | 5/2001 | Burbidge et al. | 340/10.33 |
| 6,763,492 B1 | * | 7/2004 | Hurt et al. | 714/752 |
| 2002/0034959 A1 | * | 3/2002 | Jamieson et al. | 455/517 |
| 2003/0231607 A1 | * | 12/2003 | Scanlon | H04W 74/04 370/338 |
| 2005/0208966 A1 | * | 9/2005 | David et al. | 455/553.1 |
| 2007/0115827 A1 | * | 5/2007 | Boehnke et al. | 370/236 |
| 2007/0140296 A1 | * | 6/2007 | Koppelaar | 370/470 |

(Continued)

*Primary Examiner* — Pao Sinkantarakorn
*Assistant Examiner* — Michael Phillips

(57) ABSTRACT

A method and system for wireless communication are disclosed. The method comprises: the master device generates a sequence code through a specific encoder and transmits the sequence code to each slave device continuously within a preset period according to the communication demand, wherein the specific encoder is a feedback shift register constructed by a specific polynomial, of which the coefficients and the order are in correlation with the communication demand while all of the coefficients and initial values are not equal to 0 at the same time; the preset period is greater than or equal to the sum of a sleeping period and a detecting period of the slave device, which constitutes a sleeping-and-waking cycle; the slave device receives a continuous section of the sequence code in the detecting period, decodes the sequence code through a decoder corresponding to the encoder, and performs corresponding operation according to the decoding result.

15 Claims, 3 Drawing Sheets

(56) References Cited

U.S. PATENT DOCUMENTS

| | | | |
|---|---|---|---|
| 2007/0243851 A1* | 10/2007 | Shoarinejad et al. | 455/343.2 |
| 2008/0090544 A1* | 4/2008 | Hubert et al. | 455/334 |
| 2009/0322510 A1* | 12/2009 | Berger et al. | 340/539.1 |
| 2010/0112950 A1* | 5/2010 | Haartsen et al. | 455/41.3 |
| 2011/0110256 A1* | 5/2011 | Han et al. | 370/252 |
| 2011/0158212 A1* | 6/2011 | Sakai et al. | 370/338 |
| 2011/0268020 A1* | 11/2011 | Singamneni et al. | 370/328 |
| 2013/0169406 A1* | 7/2013 | Ferron et al. | 340/2.7 |

* cited by examiner the master device generating a sequence code through a specific encoder and transmitting the sequence code to each slave device continuously within a preset period according to the communication demand, wherein the specific encoder is a feedback shift register constructed by a specific polynomial, of which the coefficients and the order are in correlation with the communication demand while all of the coefficients and initial values are not equal to 0; the preset period is greater than or equal to the sum of a sleeping period and a detecting period of the slave device, which constitutes a sleeping-and-waking cycle ⟶ S1 the specific slave device receiving a continuous section of the sequence code in the detecting period, decoding the section through a decoder corresponding to the encoder, and performing corresponding operation according to the decoding result ⟶ S2

Figure 1

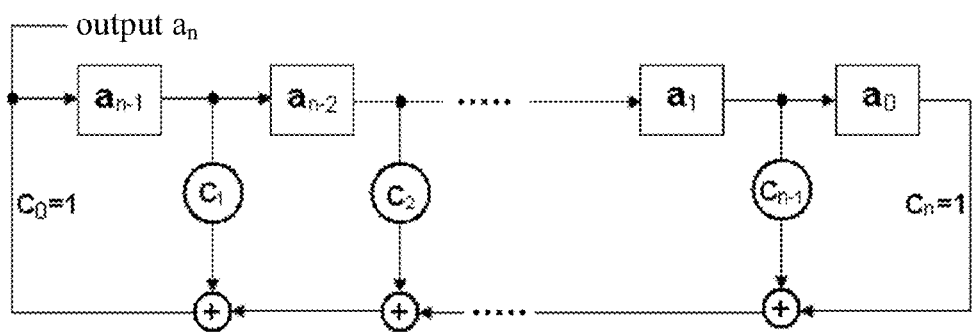

Figure 2

SYSTEM AND METHOD FOR WIRELESS COMMUNICATION

CROSS-REFERENCE TO RELATED APPLICATIONS

This application is a national stage application under 35 U.S.C. §371 of International Application No. PCT/CN2012/070203, filed on 11 Jan. 2012. The entire text of each of the above-referenced disclosures is specifically incorporated by reference herein without disclaimer.

FIELD OF THE INVENTION

The present invention relates to the technical field of communication, and more specifically relates to a system and method for wireless communication.

BACKGROUND OF THE INVENTION

Micro-power (short-range) wireless communication technology has emerged since the end of the last century, and it has been widely used in the following fields including industrial control, home intelligence, wireless remote control, security alarm, environmental monitoring, smart meter reading, toxic and harmful gas monitoring, logistics, RFID and the like after ten years of development. In recent years, the Internet of Things has been regarded as a new growth point of the future economic development after the financial crisis in domestic and international ranges. As a result, the short-range wireless communication technology will further develop in the applications of Internet of Things (especially sensor network).

The concept of Internet of Things is almost appearing at the same time with the low-carbon economy. As one of the primary communication means for the Internet of Things, the short-range wireless digital communication technology is bound to develop towards the direction with low power and micro power while complying with the developing trend that demands low-carbon and low energy consumption. In addition, battery-powered products become more and more and much stricter with the power consumption with the increasing spread of applications of mobile communication devices.

So, how to reduce the overall power consumption of the wireless communication device? Obviously, it is unrealistic only to decrease the transmitting power of the transmitter or only to reduce the current consumption of the receiver. The effect of this method is not obvious, and it will also result in harsh consequences, namely reduction in communication quality. The purpose of reducing power can be achieved only by forcing the communication device to sleep at idle period which can greatly reduce the average power consumption of the communication device. At the same time, the life of battery can be prolonged several times or even thousands of times in the battery-powered devices.

For half-duplex wireless communication system or network composed of two or more wireless transceiver devices and of any structure or protocol, the time that a certain device works in transmission or reception is indeed very little. It can greatly reduce the average power consumption by making the communication device enter the sleep mode when it does not work in transmission or reception. Since the current consumption in the sleep mode is only at a micro-ampere level and even can be a few microamps, while the transmitting current of the wireless communication device is more than tens of milliamps and the receiving current is between a dozen milliamps and tens of milliamps, the longer the sleeping period is, the lower the average power consumption of the communication system that employs the sleep mechanism is.

When a single or a group of wireless communication devices are in the sleep mode without receiving or transmitting, i.e. in a non-working state, communication will fail when other communication devices demand to communicate with them. Thus, a set of processes or methods are preferred to make the wireless communication device in the sleep mode perceive and perform communications when other devices need to communicate with it, that is, to wake up the wireless communication device in the sleep mode. Currently, there have been many methods to wake up the wireless communication devices from the sleep mode such as waking up regularly, waking up through certain signal strength and waking up through the shortest data packet. However, regarding these waking-up methods, some require synchronization in time for all communication devices in the wireless communication system, some are weak in the anti-interference capability, and others take a long time during the reception window which leads to large power consumption in the waking-up process. If it is desired to control specific communication devices, communication protocol and communication process are relatively complex and last for a long time as well, thereby resulting in large power consumption after being waken up.

SUMMARY OF THE INVENTION

The objective of the present invention is to provide a method for wireless communication which is lower in power consumption and is capable of controlling the specific communication devices based on actual communication demands, aiming at the defects of large power consumption and the complex process to control the specific communication devices according to actual communication demands in the prior art.

The technical solution adopted to solve the technical problem in the present invention is as follows: a method for wireless communication used to transmit a message to a specific slave device when a master device demands communication is provided, which comprises:

S1, the master device generates a sequence code through a specific encoder and transmits the sequence code to each slave device continuously within a preset period according to communication demand, wherein the specific encoder is a feedback shift register constructed by a specific polynomial, of which the coefficients and the order are in correlation with the communication demand while all of the coefficients and the initial value are not equal to 0. The preset period is greater than or equal to the sum of a sleeping period and a detecting period of the slave device, which constitutes a sleeping-and-waking cycle.

S2, the specific slave device receives a continuous section of the sequence code in the detecting period, decodes the section of the sequence code through a decoder corresponding to the encoder, and performs corresponding operation according to the decoding result.

In the method for wireless communication of the present invention, the sequence code generated by the encoder is in the form of m-sequence and each slave device comprises a decoder corresponding to the encoder when the communication demand is to wake up all the slave devices through broadcasting.

In the method for wireless communication of the present invention, the coefficients of the specific polynomial is the combination of a binary group number of a specific group of slave devices and a preset first fixed sequence while each slave device in the specific group comprises a decoder corresponding to the encoder when the communication demand is to wake up the slave devices in the specific group.

In the method for wireless communication of the present invention, the coefficients of the specific polynomial are at least part of a binary ID number of the specific slave device or the combination of at least part of a binary ID number of the specific slave device and a preset second fixed sequence while the specific slave device comprises a decoder corresponding to the encoder when the communication demand is to wake up the specific slave device individually.

In the method for wireless communication of the present invention, the coefficients of the specific polynomial are the combination of at least part of a binary ID number of the specific slave device and a binary sequence corresponding to a control instruction while the specific slave device comprises a decoder corresponding to the encoder when the communication demand is to transmit the control instruction to the specific slave device.

In the method for wireless communication of the present invention, the coefficients of the specific polynomial are the combination of at least part of the binary ID number of the specific slave device and a binary sequence corresponding to a preset opening-valve or closing-valve instruction while the specific slave device comprises a decoder corresponding to the encoder when the communication demand is to transmit the opening-valve or closing-valve instruction to the specific slave device, wherein the opening-valve instruction and the closing-valve instruction correspond to different binary sequences respectively.

In the method for wireless communication of the present invention, after the specific slave device has decoded the section of the sequence code through the decoder constructed by the specific feedback shift register, the same number of code element as that of the order is removed from the received sequence code, and the specific feedback shift register of the specific slave device is initialized with the initial value equal to that of the specific feedback shift register of the master device. After that, the time when the master device starts transmitting the sequence code is calculated according to the baud rate of current communication, the specific slave device is synchronized in time with the master device based on the calculated time and/or the time when the master device stops transmitting the sequence code within the preset period is then calculated, wherein the specific slave device goes to sleep before the time that has been calculated to stop transmitting the sequence code.

In the method for wireless communication of the present invention, when the specific slave device comprises at least two decoders, the specific slave device decodes the sequence code through the at least two decoders sequentially by adoption of heuristic method after receiving the sequence code, and it performs the corresponding operation according to the decoding result.

In the method for wireless communication of the present invention, in the step S1, the logic 0 or 1 of the sequence code is encoded by means of Manchester encoding method, non-return-to-zero encoding method or return-to-zero encoding method after the sequence code is generated. After that, the encoded sequence code by means of Manchester encoding method, non-return-to-zero encoding method or return-to-zero encoding method is continuously transmitted to each slave device within the preset period.

In the method for wireless communication of the present invention,
the specific slave device performing the corresponding operation according to the decoding result in the step S2 comprises:
counting the number of continuous 0 in the output after decoding;
judging whether the number of the continuous 0 in the output exceeds a preset limit, and performing corresponding operation according to the order and coefficients of the polynomial of the decoder that has been used;
or
if the master device has reversed the generated sequence code, the specific slave device performing the corresponding operation according to the decoding result in the step S2 comprises:
counting the number of continuous 1 in the output after decoding;
judging whether the number of the continuous 1 in the output exceeds a preset limit, and performing corresponding operation according to the order and coefficients of the polynomial of the decoder that has been used.

In the method for wireless communication of the present invention,
if the master device has scrambled or merged the generated sequence code, in the step S2, the specific slave device will descramble or de-merge first, decode subsequently and perform corresponding operation according to the decoding result.

A system for wireless communication is also provided in the present invention, which comprises a master device and at least one slave device, wherein the master device is operable to transmit a message to a specific slave device when demanding communication. The master device comprises:
an encoding module operable to generate a sequence code through a specific encoder, wherein the specific encoder is a feedback shift register constructed by a specific polynomial, wherein the coefficients and the order of the specific polynomial are in correlation with the communication demand, while all of the coefficients and the initial value of the polynomial are not equal to 0;
a transmitting module operable to transmit the sequence code to each slave device continuously within a preset period, wherein the preset period is greater than or equal to the sum of a sleeping period and a detecting period of the slave device, which constitutes a sleeping-and-waking cycle.

The specific slave device comprises:
a receiving module operable to receive the sequence code in the detecting period;
a decoding module operable to decode the sequence code through a decoder corresponding to the encoder;
a controlling module operable to perform corresponding operation according to the decoding result.

When implementing the technical solution of the present invention, the following advantageous effect may be achieved: it is not needed for the wireless communication devices involved in the communication to synchronize in time with each other; the anti-interference capability is strong to solve the problems of identification and false-waking so as to improve the reliability and privacy; the detecting period and the reception window of the slave device can be shortened to reduce the power consumption of the communication system.

BRIEF DESCRIPTION OF THE DRAWINGS

The present invention is further described with reference to the accompanying drawings and embodiments in the following. In the figures:

FIG. 1 is a flow chart that illustrates exemplary steps of a method for wireless communication according to an embodiment of the present invention;

FIG. 2 is a block diagram illustrating an exemplary feedback shift register in a master device according to an embodiment of the present invention;

DETAILED DESCRIPTION OF THE PREFERRED EMBODIMENT

Figure 3:
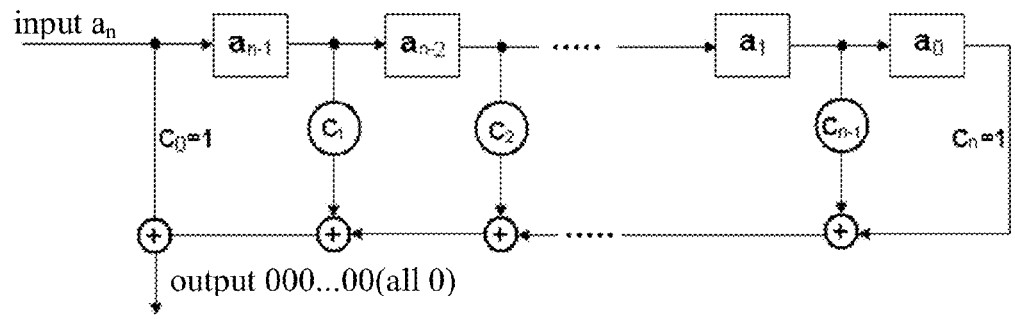
FIG. 3 is a block diagram illustrating an exemplary feedback shift register in a specific slave device according to an embodiment of the present invention.

FIG. 1 is a flow chart that illustrates exemplary steps of a method for wireless communication according to an embodiment of the present invention. The method for wireless communication is used to send a message to a specific slave device when a master device demands communication, which specifically comprises:

S1, the master device generates a sequence code through a specific encoder and transmits the sequence code to each slave device continuously within a preset period according to communication demand, wherein the specific encoder is a feedback shift register constructed by a specific polynomial, of which the coefficients and the initial value are not equal to 0. The preset period is greater than or equal to the sum of a sleeping period and a detecting period of the slave device, which constitutes a sleeping-and-waking cycle.

S2, the specific slave device receives a continuous section of the sequence code in the detecting period, decodes the section of the sequence code through a decoder corresponding to the encoder, and performs corresponding operation according to the decoding result.

The principle of the method for wireless communication will be specifically described with an example that both the encoder and the decoder are linear feedback shift registers. However, it is noted that the utilization of non-linear feedback shift registers as the encoder and decoder is also belonging to the scope of the present invention.

Typically, a polynomial of n-order is expressed as follows:

$$f(x) = c_0 + c_1 x + c_2 x^2 + \ldots + c_n x^n \quad (1)$$

Wherein, $x^i$ only indicates the value of the coefficient (1 or 0) which is represented by $c_i$, but x itself has no practical significance and does not need to be calculated. On the contrary, its coefficients and order are very important as the important parameters to implement the present invention.

The master device selects an encoder constructed by a polynomial of different coefficients or orders to generate a sequence code and transmits the sequence code to the slave devices, wherein the generated sequence code represents different meanings. The slave device receives a continuous section of the sequence code within the detecting period and decodes the sequence code one or more times through one or more relevant decoders. If one of the decoders is determined to be relevant after utilization, the slave device will be woken up and carry out corresponding operation based on the coefficients and the order of the decoder. That is to say, the sequence code generated by the master device is not only used to wake up the slave device but also carry messages. Hence, the slave device can carry out corresponding operation based on these messages, which not only reduces the power consumption, but also improves the communication efficiency.

First, the master device generates a sequence code through a specific encoder according to the communication demand, wherein the specific encoder is a feedback shift register constructed by a specific polynomial, of which the coefficients and the order are in correlation with the communication demand, while all of the coefficients and the initial value of the polynomial are not equal to 0. With reference to the structure of the feedback shift register in the master device shown in FIG. 2, the formula (1) may be characterized as:

$$a_n = c_1 a_{n-1} \oplus c_2 a_{n-2} \oplus \ldots \oplus c_{n-1} a_1 \oplus c_n a_0 \quad (2)$$

Wherein, $\oplus$ represents modulo-2 addition or XOR, n represents the order of the feedback shift register, all of the coefficients of the polynomial, $c_0 = 1, c_1, c_2, \ldots c_n$ cannot be 0, all of the initial value of $a_0, a_1, \ldots a_{n-1}$ cannot be 0, and the coefficients $c_1, c_2, \ldots c_n$ and the order n of the polynomial are relevant to the communication demand, i.e., different coefficients or orders of the feedback shift register (encoder) are used according to different communication demands.

In addition, the deformation can be obtained as follows by moving all the right part of the formula (2) to the left:

$$a_n \oplus c_1 a_{n-1} \oplus c_2 a_{n-2} \oplus \ldots \oplus c_{n-1} a_1 \oplus c_n a_0 = 0 \quad (3)$$

A new feedback shift register with input can be obtained based on the formula (3). As shown in FIG. 3, if the coefficients $c_0, c_1, c_2, \ldots c_n$ and the order n of the characteristic polynomial are the same as those of the feedback shift register shown in FIG. 2, when the input of the feedback shift register is $a_n$, regardless of its initial value, after being shifted n times to make all the irrelevant initial values of the feedback shift register be removed (it is also possible to initialize the shift register directly with the received first n correct code elements), its output is constant to 0 when being shifted. As a result, the slave device will receive a section of sequence code long enough and input it to the decoder. After the decoder has output a sufficient number of consecutive 0, it can be determined that the received code elements are correlated and they are transmitted by the master device. This process is called correlation determination.

Therefore, it can be seen from formula (2) that, for the feedback shift register of n order, there may be ($2^n-1$) kinds of coefficients for it. The larger the value of n is, the more varieties the coefficients may be. Thus, more optional polynomials and encoders can be provided to the master device of the low-power system for wireless communication. The master device selects a specific polynomial based on the communication demand before the communication is initiated. Besides, it is obvious that the coefficients and the order of the polynomial have been pre-agreed on with the slave device.

For the decoder employing the formula (3) in the slave device, the correlation of a received section of message can be determined as long as its coefficients and order are the same as those of the master device. However, if the master device has only utilized one kind of polynomial, it is possible for the slave device to use one kind of corresponding decoder for decoding. If the master device has utilized multiple polynomials, since the slave device doesn't know exactly which polynomial is used by the master device to generate the intercepted section of sequence code this time before it begins decoding, the slave device firstly has to determine this by way of heuristics, wherein the specific steps are as follows:

The master device may use M kinds of polynomials against a certain specific slave device. As a result, the slave device needs to carry out M times of heuristics from the first kind of polynomial to the M-th kind of polynomial during the decoding period. Within this period, if the correlation is determined at the N-th ($1 \leq N \leq M$) time of heuristic decoding, it is considered to have found the N-th polynomial that is matched with the polynomial used for transmitting by the master device this time, and the slave device has been woken up to perform corresponding operation according to the meaning represented by the N-th polynomial. Preferably, if the operation is an instruction that can't be mis-operated (such as turning-off a valve), the slave device can continue to receive more successive code elements, repeatedly decode to determine their correlation with the decoder corresponding to the N-th polynomial, and then decide whether to perform the operation according to the times of successfully determining the correlation and the total number of decoding. If the correlation can't be determined after M times of heuristics, it indicates that the data received this time is noise or an error code occurs in the communication, thereby no operation will be performed. As a result, the slave device will enter the sleeping period from the detecting period until the arrival of the next detecting period. Of course, the slave device can carry out M kinds of decoding in parallel if it uses a high-speed processor to complete the decoding task, and then it can determine whether it has received the message sent by the master device and which decoder has fulfilled the decoding according to the decoding result.

In accordance with the system for wireless communication of the present invention, since the master device may be provided for a plurality of slave devices and may fulfill different communication demands, the number of polynomials used by the master device may be far greater than M. Wherein, some polynomials are provided for all slave devices, such as broadcast wake-up or broadcast command; some are provided only for a part of slave devices, such as group wake-up or group command; some are provided only for a specific slave device, such as single-slave-device wake-up or single-slave-device command; or some are provided for the opening-valve/closing-valve command of a certain slave device. In practical applications, the polynomials of different coefficients or orders can be selected according to different types of communication demands.

The m-sequence can be selected to obtain the best pseudo-random sequence for the broadcast wake-up or broadcast command, as it needs relatively less polynomials.

For the group wake-up or group command, the non-zero binary group numbers can be directly used as a polynomial; or the polynomial is one-to-one associated with the group number; or some 0 or 1 can be inserted into the binary group number fixedly in the front or rear to increase the value of its order. However, all of the obtained coefficients of the polynomial cannot be 0.

For the single-slave-device wake-up, a part or the whole of the non-zero binary identification number (ID) (referred to as ID in the following) of the slave device can be directly used as a polynomial; or the polynomial is one-to-one associated with the ID; or one or more 0 or 1 can be inserted into the ID fixedly in the middle, front or rear to form a polynomial. However, all of the coefficients of the polynomial cannot be 0.

For the control instruction of a single slave device, a polynomial can be obtained by adding a fixed preset non-zero binary sequence to the ID, wherein the preset non-zero binary sequence is corresponding to the control instruction; of course, it is possible for this sequence to be inserted in the middle of the ID as a whole or be inserted in the middle, front or rear of the ID number dispersedly. The slave device then decodes with the polynomial. After the correlation has been determined, the command such as the opening-valve or closing-valve one can be performed.

Of course, in another embodiment, if the master device has reversed the generated sequence code, the specific slave device performing the corresponding operation according to the decoding result in step S2 comprises: counting the number of continuous 1 in the output after decoding; determining the correlation when judging whether the number of the continuous 1 in the output exceeds a preset limit, and performing corresponding operation according to the order and coefficients of the polynomial of the decoder that has been used.

It should be noted that, in the step of performing corresponding operation in accordance with the decoding result in the embodiment described above, the master device should uses a feedback shift register of which the order and the specific polynomial are the same as those of the feedback shift register in the specific slave device when it demands communication, so as to ensure that the encoding polynomial of the feedback shift register in the master device is matched with the decoding polynomial of the feedback shift register in the specific slave device to output continuous 0 that can be identified by the receiver of the slave device, so that the corresponding operation is performed to solve the problem of identification. Not all of the output is 0 when the random code generated by noise is substituted into the formula (3), and the probability of outputting 0 continuously will decrease in series with the increase of the input frequency. The probability of the decoder to output 0 continuously resulting from noise will tend to be 0 when the order of the feedback shift register is appropriate and the demanding number of continuous 0 is large enough, thus solving the problem of noise interference (false wake-up).

In one specific embodiment, if the communication demand is to wake up all the slave devices through broadcast, the sequence code generated by the encoder in the master device may be a m-sequence, the order of which may be selected to be 20, i.e., n=20, wherein each slave device includes a decoder corresponding to the encoder. It is obvious that, other sequences can also be involved in the encoder of the master device as long as each of the slave devices contains a decoder matched with the encoder in the master device.

In another specific embodiment, the coefficients of the specific polynomial are the combination of a binary group number of a specific group of slave devices and a preset first fixed sequence if the communication demand is to wake up the specific group of slave devices, wherein the binary length of the combination is 19, i.e. the order is 19. Besides, each slave device in the specific group comprises a decoder corresponding to the encoder. It should be noted that the fixed sequence is added to the group number to reduce the probability of false wake-up as the group number is usually short.

In another specific embodiment, the coefficients of the specific polynomial are at least part of a binary ID number of the specific slave device or the combination of at least part of a binary ID number of the specific slave device and a preset second fixed sequence while the specific slave device comprise a decoder corresponding to the encoder when the communication demand is to wake up the specific slave device individually. In one particular embodiment, for example, 16 bits are extracted from the ID number and a bit of 1 is inserted behind a certain bit of it to generate a polynomial of 17-order.

In another specific embodiment, the coefficients of the specific polynomial for the encoder of the master device are the combination of at least part of a binary ID number of the specific slave device and a binary sequence corresponding to a control command while the specific slave device comprises a decoder corresponding to the encoder when the communication demand is to transmit the control command to the specific slave device. If at least part of the ID number of the specific slave device is 16 bits, the opening-valve instruction can be set to 5 bits, thereby achieving a total of 21 bits.

In another specific embodiment, the coefficients of the specific polynomial for the encoder of the master device are the combination of at least part of a binary ID number of the specific slave device and a binary sequence corresponding to a preset opening-valve or closing-valve instruction while the specific slave device comprises a decoder corresponding to the encoder when the communication demand is to transmit the opening-valve or closing-valve instruction to the specific slave device. Herein, the opening-valve instruction and the closing-valve instruction correspond to different binary sequences respectively, and it is preferred that the difference between them is larger. If at least part of the ID number of the specific slave device is 16 bits, the closing-valve instruction can be set to 5 bits, thereby achieving a total of 21 bits.

Combined sequence code of a long cycle is preferred when combining the group number or at least part of the ID number with a particular binary sequence to form a waking-up or control polynomial.

In another specific embodiment, the specific slave device definitely comprises two decoders which are corresponding to two encoders that generate the sequence code respectively due to the different communication demands in the master device, when the master device has different communication demands at different time points, for example, it is needed to wake up a certain specific slave device at a certain time point individually and to transmit a closing-valve instruction to the specific slave device at another time point. After receiving the sequence code sent by the master device, the specific slave device will decode the sequence code through the two decoders sequentially by adoption of heuristic method, and identify the communication demand of the master device based on the involved decoder in decoding and matching process (i.e., outputting a preset number of 0 or 1 continuously) so as to perform the corresponding operation. Obviously, the number of the decoders in the slave device is not limited to two; instead, it can be any number as the communication demands increases. However, the greater the number is, the greater the calculation amount is. In addition, it is also should be noted that, the polynomials corresponding to each decoder in the slave device can be set with different orders to improve the accuracy of the decoding if the specific slave device comprises at least two decoders. Accordingly, the order of the polynomial of the corresponding encoders used in the master device is different too. For example, the order of the polynomial of the encoder is 20 if the master device is waking up all the slave devices through broadcast; the order of the polynomial of the encoder is 19 if the master device is performing the group wake-up on a certain group of slave devices; the order of the polynomial of the encoder is 17 if the master device is waking up a certain slave device individually; the order of the polynomial of the encoder is 21 if the master device is sending an opening-valve or closing-valve instruction to a certain slave device.

Furthermore, in order to improve the accuracy rate of the slave device to open or close the valve, taking the closing of the valve as an example, when the slave device has received a set of sequence codes and output a plurality of 0 after decoding through a certain decoder, and when the coefficients of the polynomial of the decoder are the combination of at least part of the ID number of the slave device and the closing-valve instruction, it indicates that the communication demand represented by the sequence code is that the master device is sending the closing-valve instruction to the slave device. More continuous code elements can be received by the receiver and the newly received sequence code is decoded several times by the decoder to avoid false operation. If more than half (e.g. 3) of the several times (e.g. 5) of decoding results are correct, the slave device can shut the valve according to the closing-valve instruction. The process is the same for the opening-valve instruction.

In another preferred embodiment, the master device encodes the logic 0 or 1 of the sequence code by means of Manchester encoding method, non-return-to-zero encoding method or return-to-zero encoding method after generating the sequence code. The bit synchronization signal can be easily and quickly separated from the receiver of the slave device by adoption of the Manchester encoding, thus shortening the detecting period. It should be emphasized that all of any other encoding methods in wireless communication such as multi-band modulation, different modulation modes, fall into the scope of the present invention.

In another preferred embodiment, the master device may scramble or merge the generated sequence code. Accordingly, the specific slave device will descramble or de-merge the received sequence code first, decode subsequently and perform corresponding operation according to the decoding result. In one example, scrambling is a XOR operation on the generated sequence code and a pseudo-random sequence code, while merging is a XOR operation on the generated sequence code and a fixed sequence code. It should be understood that descrambling and demerging are also the same operations.

Figure 4:
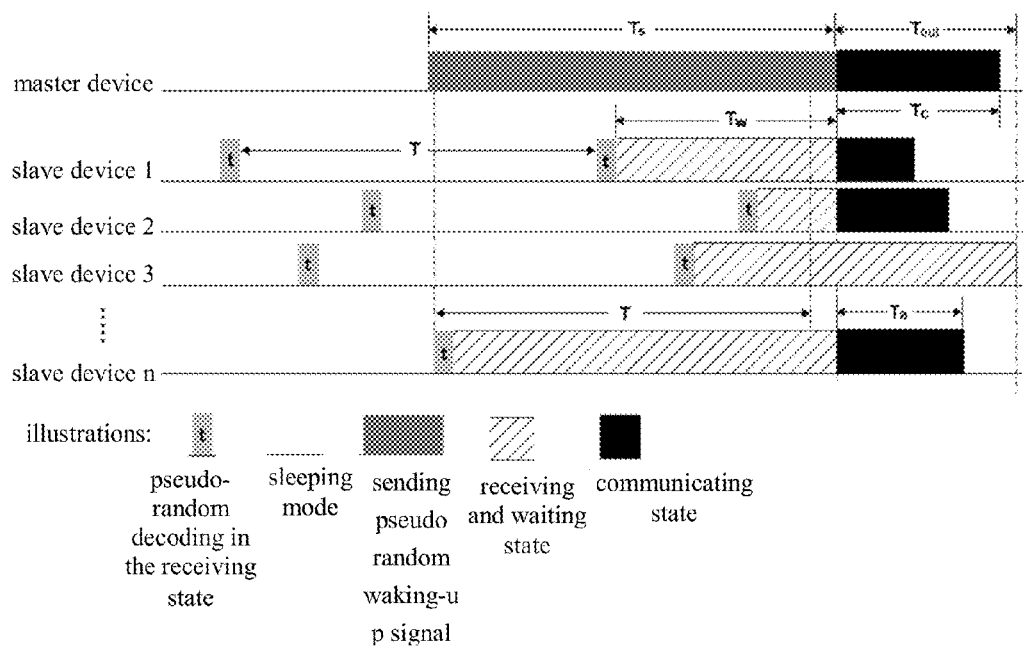
FIG. 4 is a sequence diagram illustrating the operation of the method for wireless communication according to an embodiment of the present invention.

The workflow of the master device and the slave device may be illustrated in combination with FIG. 4 as follows:

The workflow of the master device is described first. The master device generates a sequence code through a specific encoder and transmits the sequence code to each slave device continuously within a preset period $T_s$ according to the communication demand, wherein the specific encoder is a feedback shift register constructed by a specific polynomial. The feedback shift register has to be initialized before starting to work but all of the initial values can't be 0. The coefficients and the order of the specific polynomial are in correlation with the communication demand while all of them can't be equal to 0. The preset period $T_s$ follows $T_s \geq T+t$, wherein T is the sleeping period of the slave device, t is the detecting period of the slave device, and the sum of the sleeping period and the detecting period constitutes a sleeping-and-waking cycle. The master device goes into normal communication with the specific slave device after having sent the sequence code, wherein the duration of the communication is $T_c$. The specific slave device goes into sleep after having completed the data exchange. If the master device doesn't need to communicate with the slave device after having sent the sequence code, the slave device will enter the sleeping period instead of communicating with the master device after fulfilling corresponding operation. For example, the slave device will close the valve automatically after receiving a closing-valve command and enter the sleeping period after completing the operation. In this case, $T_w$ and $T_c$ are both equal to 0. For the slave devices that has failed the communication such as the slave device 3, the master device needs to start an error handling mechanism for processing.

The workflow of each slave device is described then. The slave device works alternatively in the state of sleeping-receiving-sleeping-receiving in accordance with a fixed period T+t. In the period of T, the slave device is in a sleep mode, not receiving any data and with a relatively low sleep current that reaches a few microamps. In the period of t, the slave device is in a detecting and receiving mode. In this case, the process is carried out in two ways: if the speed of the processor is high enough, the data can be processed in parallel, i.e. decoding through one or more decoders while receiving. Otherwise, it is possible to store a plurality of successive code elements that have been received and decode one or more times after having received all the code elements. If all of the decoding results are determined to be uncorrelated, it means that the received sequence is noise or some mistakes have occurred, and the slave device will enter the sleeping period without responding to the received signals. If correlation is determined by a certain decoder, it means that the communication demand represented by the sequence code that is transmitted by the master device is pointing to the decoder of the slave device, the slave device will judge out what the communication demand is based on the coefficients of the characteristic polynomial of the used decoder and enter a state to wait for effective communication with a waiting duration of $T_w$. In the period of $T_w$, the slave device still stays in the receiving state, but it is not able to communicate properly. The master device can carry out the preset proper communication with the slave device until the end of the communication when it ends sending the waking-up signal $T_s$. If issues such as communication errors occur, the error handling process will be carried out.

It should be noted that, the master device always needs to send a series of bit synchronization codes (also known as training code) so that the slave device can separate the synchronization clock according to the bit synchronization code when the slave device is receiving the waking-up bit stream. In the present invention, since in a certain section of code length of the pseudo-random sequence sent by the master device, the numbers of 0 and 1 are substantially equal and there is not many consecutive 0 or 1, the pseudo-random sequence may be used as bit synchronization, the effect of which is only a little worse than that of sending a regular code of 01010101010 . . . 0101. If the bit-synchronization separation circuit in the receiving circuit of the salve device needs the bit synchronization training code of high quality, the Manchester encoding method can be used to solve this problem, whereby enabling the receiver to separate the bit synchronization of higher quality. Thus, the sequence codes transmitted by the master device have multiple functions such as bit synchronization, waking up and the information-carrying.

In addition, important time reference information is carried in the sequence code transmitted by the master device. The slave device can be synchronized in time with the master device after calculating the time reference information. Especially when the master device is sending the sequence for broadcast wake-up or group wake-up, the slave devices are within the coverage of the master device or a group of slave devices can be synchronized in time with the master device, so that the multiple slave devices can be synchronized in time with each other as well, thus preparing the time reference for the time-based communication after being woken up. $T_w$, the period of waiting for communication after being woken up can be obtained after the time reference is calculated. As shown in FIG. 4, in the waiting period of $T_w$, the slave device can also enter the sleep mode to further reduce power consumption. The specific method for calculating the time reference is as follows:

When the correlation has been determined by a certain decoder in the slave device, the order n and the coefficients of the decoder are determined, and some correct code elements received herein that are equal to or greater than n are obtained. Herein, n correct code elements extracted from among are named as sequence L, of which the length is n. The slave device generates an encoder that is the same to the master device with these coefficients. After that, the slave device initializes the feedback shift register therein with the initial values that are the same to those of the feedback shift register in the master device and sets the variation k to be equal to 0. Then the encoding operation that is the same as that of the master device is carried out. The k will plus 1 and the value in the register will change every bit the shift register shifts. Comparing the value in the register and L, if they are not equal, the bit of the shift register will continue to be shifted and the k will plus 1, until the value in the register is equal to L. In this case, a non-zero value k is obtained, and if the baud rate is b, the time difference between the window period of the slave device and the time instant that the master device starts sending the waking-up signal is: k/b. If it takes a long time for the processor to compute and process, compensation is preferred for the computation time (the computation time of the processor can be obtained through the timer in the processor or other methods) as the accuracy requirements on the time reference cannot be ignored. Without regard to the compensation for the computation time, the time instant that the master device starts to send the waking-up signal is earlier than that of receiving the sequence L k/b. And Tw=Ts-k/b. It should be noted that, all of the sequence generated by the feedback shift register has a certain period. The longest cycle of the sequence generated by a linear feedback shift register (such as M-sequence) is $2^n-1$, while the cycle of the non-linear feedback shift register will be longer. In the practical applications, if $T_w$ is required to be calculated in the system or time synchronization is required in the device, the sequence code generated by the feedback shift register in the master device can be transmitted at a certain baud rate. Besides, the transmitting period in a cycle of the sequence code should be ≥Ts, i.e. no more than a cycle of sequence codes can be transmitted in the transmitting period of $T_s$. Otherwise, the calculation of the time reference may be wrong. As a result, m-sequence is the best choice if a linear feedback shift register is employed; and m-sequence is optional if a non-linear feedback shift register is employed.

The method for wireless communication will be illustrated in the following example, wherein, the baud rate is 19200 bps, and the value of window t (detecting period) is computed in the system according to the present invention. Assuming that a feedback shift registers of n-order (n=20) has been used, the best choice of its polynomial may be a primitive polynomial. The master device first initializes the values of each register (not all equal to 0) based on the communication demand, then encodes in baseband and modulates the sequence code generated by the feedback shift register and sequentially emits them according to the synchronization clock of 19200 bps, the duration of which is $T_s$. The value of $T_s$ is determined according to the power requirements and other requirements comprehensively. With the current technology, the slave device has to wait 3 bytes from the sleeping mode to the receiving mode, which is the time that the synchronization separation mechanism in the receiver takes to separate the stable bit synchronization. Meanwhile, the correct code elements received will be input to the decoder. After n (n=20 in this case) bits have been input, every register in the decoder will be refreshed by the received correct data with the old incorrect data being removed. At this time, the feedback shift register starts to output 0 and the signal associated with the communication demand can be found after outputting K zero continuously (K may be equal to, slightly larger than, or slightly less than n according to different applications, and here K=n). Thus, the time t that the detector takes to identify the waking-up signal is:

$$t=(3*8+n+K)/19200=(3*8+20+20)/19200≈0.00333$$
$$s=3.33 \text{ ms}$$

This time is the window period t in the present invention without doubling. But the value can be a little longer, for example, to be 3.5 ms or 4 ms, in order to be more reliable.

Figure 5:
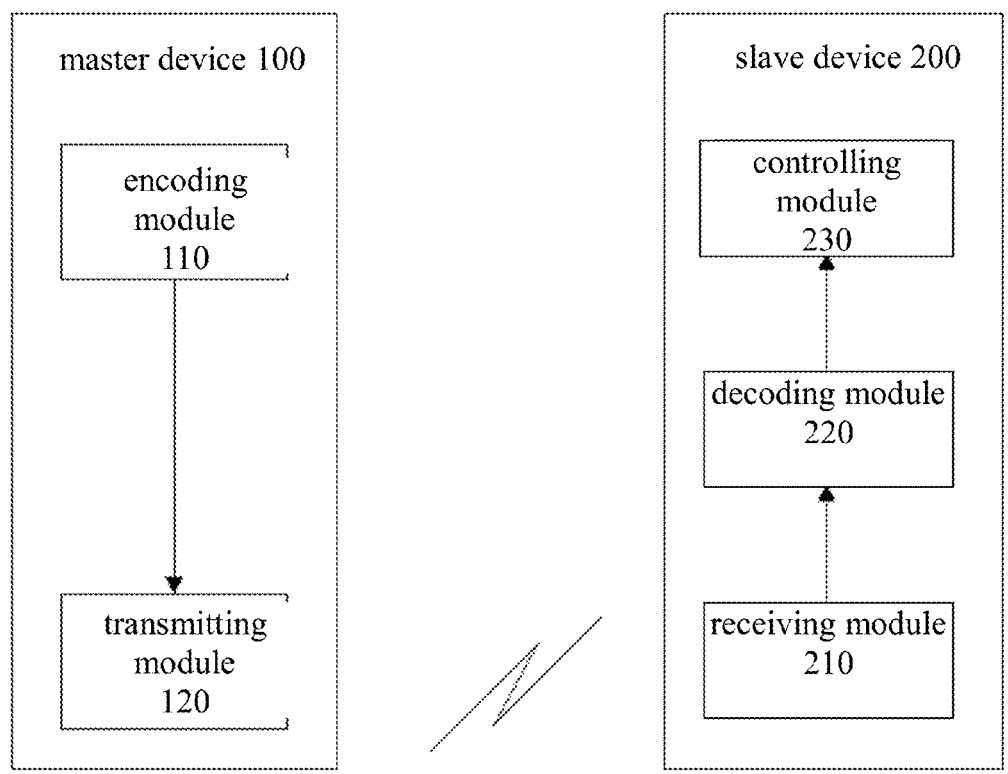
FIG. 5 is a logical structure diagram for a system for wireless communication according to an embodiment of the present invention.

FIG. 5 is a logical structure diagram illustrating an exemplary system for wireless communication according to an embodiment of the present invention. The system for wireless communication comprises a master device 100 and at least one slave devices (only a specific slave device 200 has been shown in the figure), and the master device 100 is operable to transmit a message to the specific slave device 200 when demanding communication. The master device 100 comprises an encoding module 110 and a transmitting module 120 sequentially connected to each other, and the specific slave device 200 comprises a receiving module 210, a decoding module 220 and a controlling module 230 sequentially connected to each other. In the embodiment, the encoding module 110 is operable to generate a sequence code through a specific encoder, wherein the specific encoder is a feedback shift register constructed by a specific polynomial, and the coefficients and the order of the specific polynomial are in correlation with the communication demand, while all of the coefficients and the initial value of the polynomial are not equal to 0. The transmitting module 120 is operable to transmit the sequence code to each slave device continuously within a preset period, wherein the preset period is greater than or equal to the sum of a sleeping period and a detecting period of the slave device, which constitutes a sleeping-and-waking cycle. The receiving module 210 is operable to receive the sequence code in the detecting period. The decoding module 220 is operable to decode the sequence code through a decoder corresponding to the encoder. The controlling module 230 is operable to perform corresponding operation according to the decoding result. It should be understood that the logical structure of other slave devices is the same as that of the specific slave device 200 while only the coefficients of the polynomial used in the one or more decoding modules are different. Obviously, it is possible for several slave devices to use the same decoders. Thus, the master may generate different sequence codes through different encoders according to different communication demands and only a specific decoder in a specific slave device can decode the sequence codes correctly. As a result, the specific slave device can determine the communication demand of the master device to perform corresponding operation based on the specific decoder in use. It should be noted that, the concepts of the master device and the slave device in the context are just relatively defined. Any device that needs to start communication in the system can wake up and control other devices in accordance with the steps of the master device in the context. That is to say, the roles of the master device and the slave device can be interchanged flexibly.

It should be noted that the encoder and decoder mentioned in the present invention can be implemented in hardware or software. Software is preferred to reduce costs and to achieve better flexibility.

The above introduction and description are only in form of preferred embodiments of the invention, but not limitations of the invention. Various modifications and changes can be made to the present invention for the skilled in the art. It will be appreciated that any modifications, equivalents and improvements made without departing from the spirit and principles of the present invention should fall within the scope of the present invention.

The invention claimed is:

1. A method for wireless communication used to transmit a message to a specific slave device when a master device demands communication, wherein comprising:
   S1, the master device generating a sequence code through a specific encoder and transmitting the sequence code to each slave device continuously within a preset period according to the communication demand, wherein the specific encoder is a specific feedback shift register constructed by a specific polynomial, of which the coefficients and the order are in correlation with the communication demand, while all of the coefficients and initial values are not equal to 0; the preset period is greater than or equal to the sum of a sleeping period and a detecting period of the slave device, which constitutes a sleeping-and-waking cycle;
   S2, the specific slave device receiving a continuous section of the sequence code in the detecting period, decoding the continuous section of the sequence code through a decoder corresponding to the specific encoder, and performing corresponding operation according to the decoding result;
   wherein after the specific slave device has decoded the continuous section of the sequence code through the decoder constructed by the specific feedback shift register, removing a same number of code elements as that of the order from received sequence code, and initializing the specific feedback shift register of the specific slave device with the initial value equal to that of the specific feedback shift register of the master device, then calculating a time when the master device starts transmitting the sequence code according to a baud rate of current communication, and synchronizing in time with the master device based on calculated time and/or calculating a time when the master device stops transmitting the sequence code within the preset period, wherein the specific slave device goes to sleep before the time that has been calculated to stop transmitting the sequence code.

2. The method for wireless communication of claim 1, wherein, the sequence code generated by the specific encoder is in the form of m-sequence and each slave device comprises the decoder corresponding to the specific encoder when the communication demand is to wake up all the slave devices through broadcasting.

3. The method for wireless communication of claim 1, wherein, the coefficients of the specific polynomial are the combination of a binary group number of a specific group of slave devices and a preset first fixed sequence while each slave device in the specific group comprises the decoder corresponding to the specific encoder when the communication demand is to wake up the slave devices in the specific group.

4. The method for wireless communication of claim 1, wherein, the coefficients of the specific polynomial are at least part of a binary ID number of the specific slave device or the combination of at least part of a binary ID number of the specific slave device and a preset second fixed sequence while the specific slave device comprise the decoder corresponding to the specific encoder when the communication demand is to wake up the specific slave device individually.

5. The method for wireless communication of claim 1, wherein, the coefficients of the specific polynomial are the combination of at least part of a binary ID number of the specific slave device and a binary sequence corresponding to a control instruction while the specific slave device comprises the decoder corresponding to the specific encoder when the communication demand is to transmit the control instruction to the specific slave device.

6. The method for wireless communication of claim 5, wherein, the coefficients of the specific polynomial are the combination of at least part of the binary ID number of the specific slave device and a binary sequence corresponding to a preset opening-valve or closing-valve instruction while the specific slave device comprises the decoder corresponding to the specific encoder when the communication demand is to transmit the opening-valve or closing-valve instruction to the specific slave device, wherein the opening-valve instruction and the closing-valve instruction correspond to different binary sequences, respectively.

7. The method for wireless communication of claim 2, wherein, when the specific slave device comprises at least two decoders, the specific slave device decodes the sequence code through the at least two decoders sequentially by adoption of heuristic method after receiving the sequence code, and performs the corresponding operation according to the decoding result.

8. The method for wireless communication of claim 3, wherein, when the specific slave device comprises at least two decoders, the specific slave device decodes the sequence code through the at least two decoders sequentially by adoption of heuristic method after receiving the sequence code, and performs the corresponding operation according to the decoding result.

9. The method for wireless communication of claim 4, wherein, when the specific slave device comprises at least two decoders, the specific slave device decodes the sequence code through the at least two decoders sequentially by adoption of heuristic method after receiving the sequence code, and performs the corresponding operation according to the decoding result.

10. The method for wireless communication of claim 5, wherein, when the specific slave device comprises at least two decoders, the specific slave device decodes the sequence code through the at least two decoders sequentially by adoption of heuristic method after receiving the sequence code, and performs the corresponding operation according to the decoding result.

11. The method for wireless communication of claim 6, wherein, when the specific slave device comprises at least two decoders, the specific slave device decodes the sequence code through the at least two decoders sequentially by adoption of heuristic method after receiving the sequence code, and performs the corresponding operation according to the decoding result.

12. The method for wireless communication of claim 1, wherein, in the step S1, encoding the logic 0 or 1 of the sequence code by means of Manchester encoding method, non-return-to-zero encoding method or return-to-zero encoding method after the sequence code is generated, and then transmitting the encoded sequence code by means of Manchester encoding method, non-return-to-zero encoding method or return-to-zero encoding method continuously to each slave device within the preset period.

13. The method for wireless communication of claim 1, wherein,
the specific slave device performing the corresponding operation according to the decoding result in step S2 comprises:
counting the number of continuous 0 in the output after decoding;
judging whether the number of the continuous 0 in the output exceeds a preset limit, and performing corresponding operation according to the order and coefficients of the polynomial of the decoder that has been used; or
if the master device has reversed the generated sequence code, the specific slave device performing the corresponding operation according to the decoding result in step S2 comprises:
counting the number of continuous 1 in the output after decoding;
judging whether the number of the continuous 1 in the output exceeds a preset limit, and performing corresponding operation according to the order and coefficients of the polynomial of the decoder that has been used.

14. The method for wireless communication of claim 1, wherein,
if the master device has scrambled or merged the generated sequence code, in the step S2, the specific slave device will descramble or de-merge first, decode subsequently and perform corresponding operation according to the decoding result.

15. A system for wireless communication, which comprises a master device and at least one slave device, and the master device is operable to transmit a message to a specific slave device when demanding communication, wherein, the master device comprises:
an encoding module operable to generate a sequence code through a specific encoder, wherein the specific encoder is a specific feedback shift register constructed by a specific polynomial, and the coefficients and the order of the specific polynomial are in correlation with the communication demand, while all of the coefficients and the initial value of the polynomial are not equal to 0;
a transmitting module operable to transmit the sequence code to each slave device of the at least one slave device continuously within a preset period, wherein the preset period is greater than or equal to the sum of a sleeping period and a detecting period of the each slave device, which constitutes a sleeping-and-waking cycle;
the each slave device comprises:
a receiving module operable to receive the sequence code in the detecting period;
a decoding module operable to decode the sequence code through a decoder corresponding to the specific encoder;

a controlling module operable to perform corresponding operation according to the decoding result;

wherein after the specific slave device has decoded a continuous section of the sequence code through the decoder constructed by the specific feedback shift register, removing a same number of code elements as that of the order from received sequence code, and initializing the specific feedback shift register of the specific slave device with the initial value equal to that of the specific feedback shift register of the master device, then calculating a time when the master device starts transmitting the sequence code according to a baud rate of current communication, and synchronizing in time with the master device based on calculated time and/or calculating a time when the master device stops transmitting the sequence code within the preset period, wherein the specific slave device goes to sleep before the time that has been calculated to stop transmitting the sequence code.

\* \* \* \* \*